United States Patent
Chen et al.

(10) Patent No.: US 9,034,760 B2
(45) Date of Patent: May 19, 2015

(54) METHODS OF FORMING TENSILE TUNGSTEN FILMS AND COMPRESSIVE TUNGSTEN FILMS

(71) Applicant: Novellus Systems, Inc., Fremont, CA (US)

(72) Inventors: Feng Chen, San Jose, CA (US); Tsung-Han Yang, San Jose, CA (US); Juwen Gao, San Jose, CA (US); Roey Shaviv, Palo Alto, CA (US); Raashina Humayun, Los Altos, CA (US); Deqi Wang, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 23 days.

(21) Appl. No.: 13/928,216

(22) Filed: Jun. 26, 2013

(65) Prior Publication Data

US 2014/0011358 A1    Jan. 9, 2014

Related U.S. Application Data

(60) Provisional application No. 61/666,466, filed on Jun. 29, 2012.

(51) Int. Cl.
*H01L 21/44* (2006.01)
*H01L 21/285* (2006.01)
*H01L 21/768* (2006.01)

(52) U.S. Cl.
CPC .... *H01L 21/28506* (2013.01); *H01L 21/76843* (2013.01); *H01L 21/28562* (2013.01); *H01L 21/76876* (2013.01); *H01L 21/76877* (2013.01); *H01L 21/28556* (2013.01)

(58) Field of Classification Search
CPC ............... H01L 21/28556; H01L 21/28562; H01L 21/76876; H01L 21/76877; H01L 21/76843

USPC .................. 438/656, 680, 681, 648, 685, 790
See application file for complete search history.

(56) References Cited

U.S. PATENT DOCUMENTS

| 4,746,375 A | 5/1988 | Lacovangelo |
| 4,804,560 A | 2/1989 | Shioya et al. |

(Continued)

FOREIGN PATENT DOCUMENTS

| JP | 2005/518088 | 6/2005 |
| JP | 2009-144242 | 7/2009 |

(Continued)

OTHER PUBLICATIONS

U.S. Appl. No. 13/758,928, filed Feb. 4, 2013, entitled "Methods for Forming All Tungsten Contacts and Lines."

(Continued)

*Primary Examiner* — Bac Au
(74) *Attorney, Agent, or Firm* — Weaver Austin Villeneuve & Sampson LLP

(57) ABSTRACT

Methods, apparatus, and systems for depositing tensile or compressive tungsten films are described. In one aspect, a method includes providing a substrate to a chamber. The substrate has a field region and a feature recessed from the field region. Then, the substrate is exposed to an organometallic tungsten precursor. The organometallic tungsten precursor not adsorbed onto the substrate is removed from the chamber. The substrate is treated with a first treatment including a heat treatment or a plasma treatment to form a tungsten layer on the substrate. After treating the substrate, residual gasses are removed from the chamber. The tungsten layer on the substrate is treated with a second treatment including a heat treatment or a plasma treatment.

21 Claims, 10 Drawing Sheets

(56) References Cited

U.S. PATENT DOCUMENTS

| | | | |
|---|---|---|---|
| 4,874,719 A | 10/1989 | Kurosawa | |
| 5,028,565 A | 7/1991 | Chang et al. | |
| 5,227,329 A | 7/1993 | Kobayashi et al. | |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,926,720 A | 7/1999 | Zhao et al. | |
| 5,956,609 A | 9/1999 | Lee et al. | |
| 6,001,729 A | 12/1999 | Shinriki et al. | |
| 6,017,818 A | 1/2000 | Lu | |
| 6,037,263 A | 3/2000 | Chang | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,491,978 B1 * | 12/2002 | Kalyanam | 427/255.394 |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,593,233 B1 | 7/2003 | Miyazaki et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,262,125 B2 | 8/2007 | Wongsenakhum et al. | |
| 7,416,979 B2 | 8/2008 | Yoon et al. | |
| 7,429,402 B2 | 9/2008 | Gandikota et al. | |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,101,521 B1 | 1/2012 | Gao et al. | |
| 8,110,877 B2 | 2/2012 | Mukherjee et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2005/0191803 A1 | 9/2005 | Matsuse et al. | |
| 2006/0003581 A1 | 1/2006 | Johnston et al. | |
| 2006/0094238 A1 | 5/2006 | Levy et al. | |
| 2007/0099420 A1 | 5/2007 | Dominguez et al. | |
| 2007/0190780 A1 | 8/2007 | Chung et al. | |
| 2008/0045010 A1 | 2/2008 | Wongsenakhum et al. | |
| 2008/0081127 A1 | 4/2008 | Thompson et al. | |
| 2008/0124926 A1 | 5/2008 | Chan et al. | |
| 2008/0254623 A1 | 10/2008 | Chan et al. | |
| 2008/0280438 A1 | 11/2008 | Lai et al. | |
| 2009/0149022 A1 | 6/2009 | Chan et al. | |
| 2009/0160030 A1 | 6/2009 | Tuttle | |
| 2009/0163025 A1 | 6/2009 | Humayun et al. | |
| 2010/0035427 A1 | 2/2010 | Chan et al. | |
| 2010/0055904 A1 | 3/2010 | Chen et al. | |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |
| 2012/0244699 A1 | 9/2012 | Khandelwal et al. | |

FOREIGN PATENT DOCUMENTS

| | | |
|---|---|---|
| KR | 20050022261 | 3/2005 |
| KR | 20050087428 | 8/2005 |
| KR | 20080110897 | 12/2008 |
| WO | 01/27347 | 4/2001 |
| WO | 2005/027211 | 3/2005 |
| WO | 2007/121249 | 10/2007 |
| WO | 2010/025357 | 3/2010 |

OTHER PUBLICATIONS

U.S. Appl. No. 13/560,688, filed Jul. 27, 2012, entitled "Methods of improving Tungsten Contact Resistance in Small Critical Dimension Features."

U.S. Appl. No. 13/633,798, filed Oct. 2, 2012, entitled "Method for Depositing Tungsten Film With Low Roughness and Low Resistivity."

U.S. Appl. No. 13/633,502, filed Oct. 2, 2012, entitled "Method for Producing Ultra-Thin Tungsten Layers With Improved Step Coverage."

U.S. Appl. No. 13/774,350, filed Feb. 22, 2013, entitled "Tungsten Feature Fill With Nucleation Inhibition."

U.S. Appl. No. 13/851,885, filed Mar. 27, 2013, entitled "Tungsten Feature Fill."

U.S. Appl. No. 13/862,048, filed Apr. 12, 2013, entitled "CVD Based Metal/Semiconductor Ohmic Contact for High Volume Manufacturing Applications."

(56) References Cited

OTHER PUBLICATIONS

US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Jan. 19, 2005, issued in U.S. Appl. No. 10/435,010.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.

(56) References Cited

OTHER PUBLICATIONS

Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
US Office Action dated Jun. 20, 2013, issued in U.S. Appl. No. 13/560,688.
US Office Action dated Jun. 14, 2013, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
PCT International Search Report and Written Opinion, dated Apr. 12, 2010, issued in PCT/US2009/055349.
Chinese Office Action dated Sep. 18, 2012 issued in application No. 200980133560.1.
Korean Office Action dated Sep. 6, 2012 issued in application No. 2011-7004322.
Korean Office Action dated Mar. 21, 2013 issued in KR Application No. 2010-0024905.
Korean Notification of Provisional Rejection dated Jul. 17, 2012, issued in Application No. 2010-0087997.
Korean Office Action dated Mar. 4, 2013 in KR Application No. 2010-0035449.
Korean Office Action dated Mar. 4, 2013 in KR Application No. 2010-0035453.
Bell et al. (Jan. 1996) "Batch Reactor Kinetic Studies of Tungsten LPCVD from Silane and Tungsten Hexafluoride", J. Electrochem. Soc., vol. 143, No. 1, pp. 296-302.
Collins et al. (Jan. 21, 2003) "Pulsed Deposition of Ultra Thin Tungsten for Plugfill of High Aspect Ratio Contacts," Presentation made at Semicon Korea, 9 pages.
Collins et al. (Jan. 21, 2003) "Pulsed Deposition of Ultra Thin Tungsten for Plugfill of High Aspect Ratio Contacts," Semiconductor Equipment and Materials International, Semicon Korea, 3 pages.
Elam et al. (2001) "Nucleation and Growth During Tungsten Atomic Layer Deposition on $SiO_2$ Surfaces," Thin Solid Films, 13 Pages.
George et al. (1996) "Surface Chemistry for atomic Layer Growth", J. Phys. Chem, vol. 100, No. 31, pp. 13121-13131.
Hoover, Cynthia. (2007) "Enabling Materials for Contact Metallization," Praxair Electronic Materials R&D, pp. 1-16.
Lai, Ken K. and Lamb, H. Henry (1995) "Precursors for Organometallic Chemical Vapor Deposition of Tungsten Carbide Films", *Chemistry Material*, pp. 2284-2292.
Klaus et al. (2000) "Atomic layer deposition of tungsten using sequential surface chemistry with a sacrificial stripping reaction", Thin Solid Films 360 145-153.
Klaus et al. (2000) "Atomically Controlled Growth of Tungsten and Tungsten Nitride Using Sequential Surface Reactions," Applied Surface Science, 162-163, 479-491.
Lee et al. (Jan. 21, 2003) Pulsed Deposition of Ultra Thin Tungsten and its Application for Plugfill of High Aspect Ratio Contacts, Abstract, 1 page.
Li et al. (2002) "Deposition of $WN_xC_y$ Thin Films by ALCVD™ Method for Diffusion Barriers in Metallization," IITC Conference Report, 3 Pages.
Presentation by Inventor James Fair. (1983) "Chemical Vapor Deposition of Refractory Metal Silicides," 27 Pages.
Purchase of ethylcyclopentadienyl)dicarbonylnitrosyltungsten from Praxair (2006).
Saito et al. (2001) "A Novel Copper Interconnection Technology Using Self Aligned Metal Capping Method," IEEE, 3 Pages.

\* cited by examiner

METHODS OF FORMING TENSILE TUNGSTEN FILMS AND COMPRESSIVE TUNGSTEN FILMS

CROSS-REFERENCE TO RELATED APPLICATION

This application claims the benefit of priority to U.S. Provisional Application No. 61/666,466, tilted "METHODS OF FORMING TENSILE TUNGSTEN FILMS AND COMPRESSIVE TUNGSTEN FILMS," filed Jun. 29, 2012, all of which is incorporated herein by this reference for all purposes.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

SUMMARY

Methods, apparatus, and systems for depositing tensile and compressive tungsten films are provided. Also provided are integration methods involving depositing tensile and/or compressive tungsten films, for example, as contacts and/or metal gates, and semiconductor devices incorporating the tungsten films.

In some embodiments, a method includes providing a substrate to a chamber. The substrate has a field region and a feature recessed from the field region. The substrate is exposed to an organometallic tungsten precursor. The organometallic tungsten precursor not adsorbed onto the substrate is removed from the chamber. The substrate is treated with a first treatment including a heat treatment or a plasma treatment to form a tungsten layer on the substrate. After treating the substrate, residual gasses are removed from the chamber. The tungsten layer on the substrate is treated with a second treatment including a heat treatment or a plasma treatment.

In some embodiments, a deposition apparatus includes a chamber and a controller. The controller includes program instructions for conducting a process including providing a substrate to a chamber. The substrate has a field region and a feature recessed from the field region. The substrate is exposed to an organometallic tungsten precursor. The organometallic tungsten precursor not adsorbed onto the substrate is removed from the chamber. The substrate is treated with a first treatment including a heat treatment or a plasma treatment to form a tungsten layer on the substrate. After treating the substrate, residual gasses are removed from the chamber. The tungsten layer on the substrate is treated with a second treatment including a heat treatment or a plasma treatment.

In some embodiments, a non-transitory computer machine-readable medium includes program instructions for control of a chamber. The instructions include code for providing a substrate to the chamber. The substrate has a field region and a feature recessed from the field region. The substrate is exposed to an organometallic tungsten precursor. The organometallic tungsten precursor not adsorbed onto the substrate is removed from the chamber. The substrate is treated with a first treatment including a heat treatment or a plasma treatment to form a tungsten layer on the substrate. After treating the substrate, residual gasses are removed from the chamber. The tungsten layer on the substrate is treated with a second treatment including a heat treatment or a plasma treatment.

These and other aspects of the disclosed embodiments are described further below with reference to the figures.

BRIEF DESCRIPTION OF THE DRAWINGS

The accompanying drawings, which are incorporated in and form part of the specification, illustrate the disclosed embodiments, and together with the detailed description, serve to explain the disclosed embodiments.

DETAILED DESCRIPTION

Introduction

Figure 1:
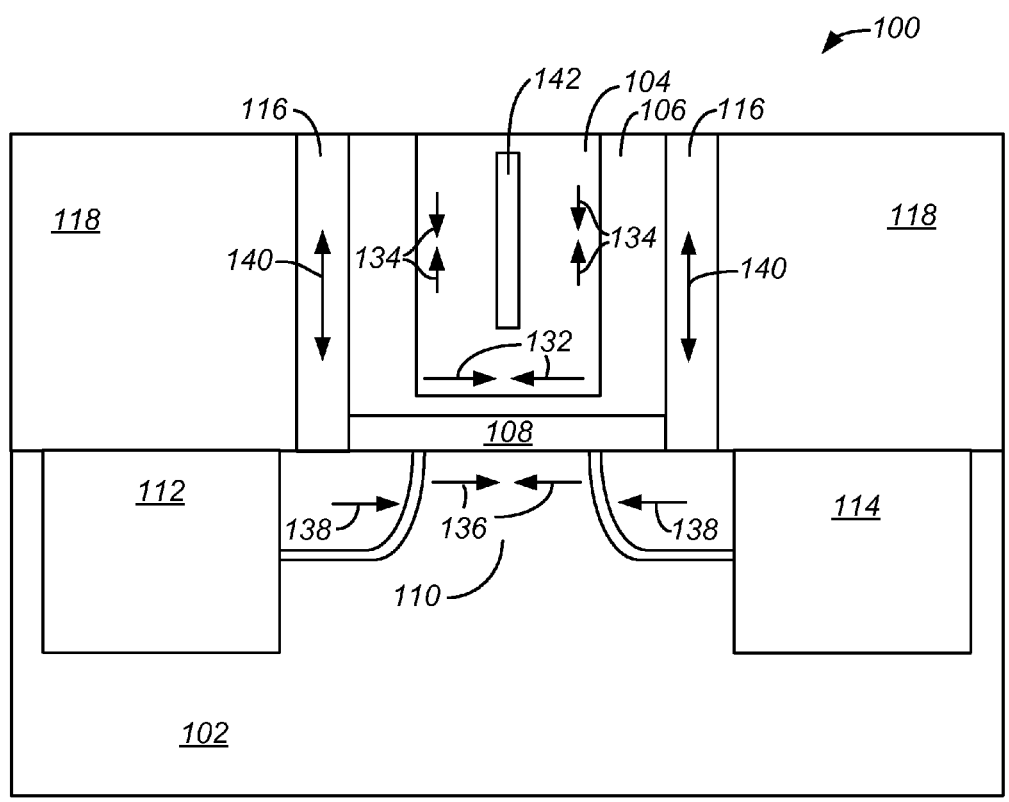
FIG. 1 is a schematic diagram of a PMOS device according to some embodiments.

In the following detailed description, numerous specific embodiments are set forth in order to provide a thorough understanding of the disclosed embodiments. However, as will be apparent to those of ordinary skill in the art, the embodiments may be practiced without these specific details or by using alternate elements or processes. In other instances well-known processes, procedures, and components have not been described in detail so as not to unnecessarily obscure aspects of the embodiments.

In this application, the terms "semiconductor wafer," "wafer," and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description assumes the embodiments are implemented on a wafer. However, the embodiments are not so limited. The work piece may be of various shapes, sizes, and materials. In addition to semiconductor wafers, other work pieces that may take advantage of the embodiments include various articles such as printed circuit boards and the like.

The straining of silicon in order to increase the mobility of charge carriers is used in technology nodes of 90 nanometers (nm) and smaller. This may be done by introducing high tensile stress nitride liners as the first step in a pre-metal dielectric sequence. For example, a nitride liner film is used to strain silicon in a metal-oxide-semiconductor field-effect transistor (MOSFET); a tensile film is used to strain an n-type metal-oxide-semiconductor field-effect transistor (NMOS) and a compressive film is used to strain a p-type metal-oxide-semiconductor field-effect transistor (PMOS). Straining the channel region of a NMOS device to increase the lattice constant of the silicon in this region increases the mobility of electrons in the channel region, improving device performance. Straining the channel region of a PMOS device to decrease the lattice constant of the silicon in this region increases the mobility of holes in the channel region, improving device performance. Increasing the mobility of charge carriers, i.e., electrons or holes, in field-effect transistor devices allows the devices to operate faster and with less power loss. In "gate-last" integration MOSFET devices and in fin field effect transistor (FinFET) devices, however, high tensile stress films are located a distance away from the silicon, and as a result their effect on device performance is compromised.

Semiconductor device performance may also be improved by varying the stress induced by metal films formed in the gate and contacts of a semiconductor device. Traditionally, aluminum is used as the gate metal in gate-last integration of semiconductor devices, and does not significantly stress the underling channel region. A compressive tungsten film as a metal in a NMOS device metal gate or a tensile tungsten film as a metal in a PMOS device metal gate, however, may be used to enhance device performance, as described further below. Further, the stress of a tungsten metal film inside the contact of a semiconductor device plays no significant role in traditional semiconductor manufacturing. A tensile tungsten film in NMOS device contacts or a compressive tungsten film in PMOS device contacts, however, may be used to enhance device performance, as also described further below.

A typical tungsten film used to fill a high-aspect ratio feature may be a high tensile stress film to provide good conformity, plug fill, and adhesion to barrier layers. The stress level in such a tungsten film ranges from about $1.2 \times 10^{10}$ dyne/cm$^2$ (1.2 gigapascals) to about $1.4 \times 10^{10}$ dyne/cm$^2$ (1.4 gigapascals) for a film thicker than about 2,000 Å. A typical tungsten film used as an interconnect may be a low tensile stress film, which may not have good step coverage. The stress level in such a low tensile stress film may be less than about $1 \times 10^{10}$ dyne/cm$^2$ (1 gigapascal) for a film thicker than about 2,000 Å.

Tungsten deposition methods disclosed herein may produce tensile and compressive films to achieve strain enhancement in PMOS devices, NMOS devices, and other semiconductor device applications. Tensile tungsten films and methods of producing tensile tungsten films are further described in U.S. patent application Ser. No. 13/020,748, filed Feb. 3, 2011, which is herein incorporated by reference. Devices To improve PMOS device performance, the mobility of holes in the channel region under the gate region of the device should be increased. This may be achieved by straining the silicon under the gate to reduce the lattice constant. A SiGe alloy in the source and drain areas, with a lattice constant greater than that of the silicon under the gate, is often used to strain the silicon under the gate to reduce the lattice constant.

Similarly, a tensile stress metal filling the gate would exert a force on the silicon in the channel, reducing the lattice constant. Thus, a tensile stress metal gate, applying a compressive force to the silicon, would benefit PMOS device performance.

FIG. 1 is a schematic diagram of a PMOS device according to some embodiments. The PMOS device 100 shown in FIG. 1 includes a substrate 102, a conductive gate 104 separated from the substrate 102 by a metal 106, and a gate dielectric 108. The channel region 110 in the substrate 102 separates p-type source 112 and drain 114 regions. Dielectric spacers 116 are associated with the gate region. A dielectric film 118 completes the depicted PMOS device. Note that contacts for the source 112 and drain 114 regions are not shown in FIG. 1. The substrate 102 is silicon in some embodiments. The source 112 and the drain 114 regions may include a SiGe alloy to reduce the lattice constant of the substrate in the channel region 110 in some embodiments. Gallium arsenide and other semiconductor materials, for example, may also be used as the substrate 102, the source 112, and the drain 114.

In some embodiments the conductive gate 104 of the PMOS device 100 includes a tensile tungsten film. The vectors shown in FIG. 1 illustrate the effect of a tensile tungsten film in the PMOS device 100. The tensile tungsten film may exhibit different stresses. Some stresses in the tensile tungsten film may be in a plane parallel to the plane of the substrate 102 (parallel stresses) and some stresses in the tensile tungsten film may be in a plane normal to the plane of the substrate 102 (normal stresses). The parallel stresses of the tensile tungsten film are indicated by vectors 132. The normal stresses of the tensile tungsten film are indicated by vectors 134.

The substrate 102 is strained by the parallel stresses of the tensile tungsten film in the conductive gate 104. The parallel stresses 132 of the tungsten exert a strain 136 on the channel region 110. The parallel stresses 132 are compressive and reduce the lattice constant of the channel region 110 of the substrate 102, which increases the mobility of holes in the channel region. The stresses 132 are added to the stresses 138 exerted on the channel region by the source 112 and drain 114 regions when the source and drain regions include SiGe, for example.

In some embodiments the normal stresses of the tensile tungsten film play a minimal role in the PMOS device 100. The normal stresses 134 of the tungsten are balanced by the stresses 140 of the compressive dielectric spacers and may have no effect on the substrate 102 lattice constant. If present, the small seam 142 at the center of the tensile tungsten film of the conductive gate 104 may also aid in neutralizing the normal stresses. As a result, the parallel stresses 132 of the tungsten at the bottom of the conductive gate 104 may have a significant effect on the lattice constant of the substrate 102, and not the normal stresses 134.

To improve NMOS device performance, the mobility of electrons in the channel under the gate should be increased. This is achieved with a tensile dielectric film encapsulating the NMOS device in some embodiments. The dielectric film strains the source and drain areas, which in turn increases the lattice constant in the channel. A compressive or stress free metal gate would therefore benefit NMOS performance. Titanium nitride (TiN) or tantalum nitride (TaN) may be used in the metal gate region to aid in increasing the lattice constant in the channel. Similarly, a compressive tungsten metal gate would exert a tensile stress on the silicon in the channel, increasing the lattice constant in the channel.

Figure 2:
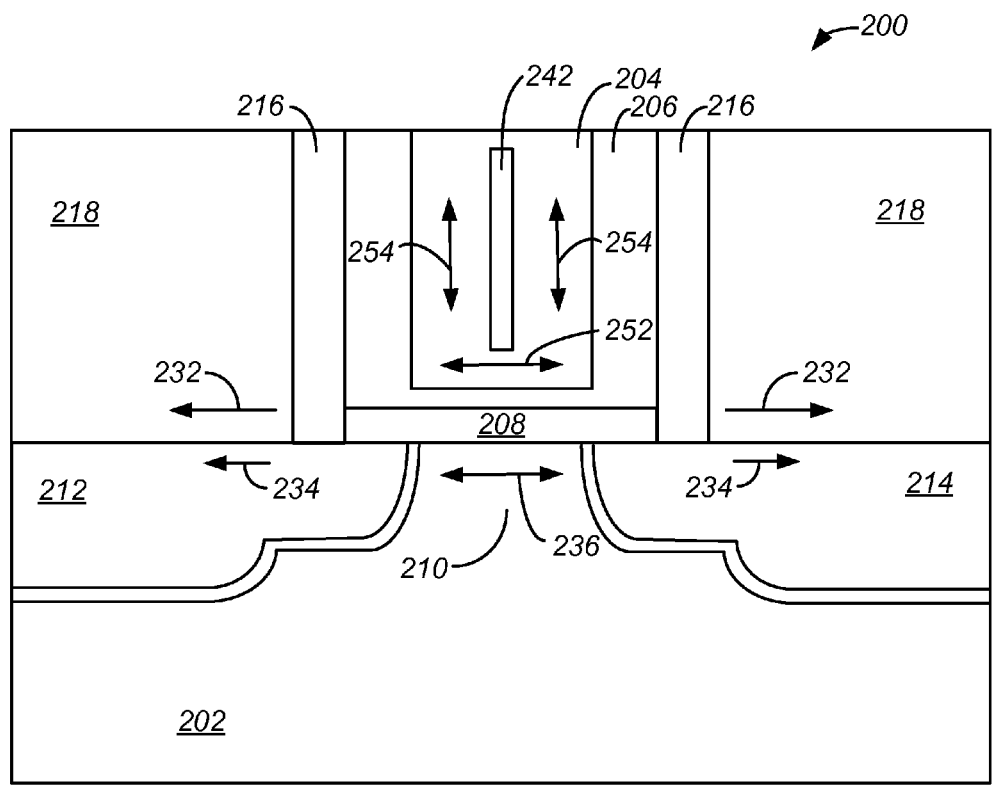
FIG. 2 is a schematic diagram of a NMOS device according to some embodiments.

FIG. 2 is a schematic diagram of a NMOS device according to some embodiments. The NMOS device 200 shown in FIG. 2 includes a substrate 202, a conductive gate 204 separated from the substrate 202 by a metal 206 and a gate dielectric 208. The channel region 210 in the substrate 202 separates n-type source 212 and drain 214 regions. Dielectric spacers 216 are associated with the gate region. A dielectric film 218 completes the depicted NMOS device. Note that contacts for the source 212 and drain 214 regions are not shown in FIG. 2.

The dielectric film 218 is a tensile dielectric film in some embodiments. The vectors shown in FIG. 2 illustrate the effect of a tensile dielectric film in the NMOS device 200. The parallel stresses 232 of the tensile dielectric film exert stresses 234 on the source 212 and drain 214 regions. The stresses 234 in turn create a strain 236 in the channel region 210 which increases the mobility of electrons in the channel region.

In some embodiments the conductive gate 204 of the NMOS device 200 includes a compressive tungsten film. Some stresses in the compressive tungsten film may be in a plane parallel to the plane of the substrate 202 (parallel stresses) and some stresses in the compressive tungsten film may be in a plane normal to the plane of the substrate 202 (normal stresses). The parallel stresses of the compressive tungsten film are indicated by vectors 252. The normal stresses of the compressive tungsten film are indicated by vectors 254.

The substrate 202 is strained by the parallel stresses of the compressive tungsten film in the conductive gate 204. The parallel stresses 252 of the tungsten exert a strain 236 on the channel region 210. The parallel stresses 252 are tensile and increase the lattice constant of the channel region 210 of the substrate 202, which increases the mobility of electrons in the channel region. The stresses 252 are added to the stresses 234 exerted on the channel region by the tensile dielectric film 218, for example. In some embodiments, a seam 242 is present in the gate 204.

PMOS and NMOS device performance by stress control may also be achieved using a compressive or a tensile metal in the contacts to source and drain, respectively. Tungsten metal is the traditional and most wildly used contact metallization metal. Tailoring the stress of the tungsten inside the source and drain contacts offers an effective, cost neutral, and reliable method for enhancing device performance. This approach is compatible with both the traditional cylindrical contact metallization and with the emerging technology using cylindroid-shaped contact metallization.

Figure 3:
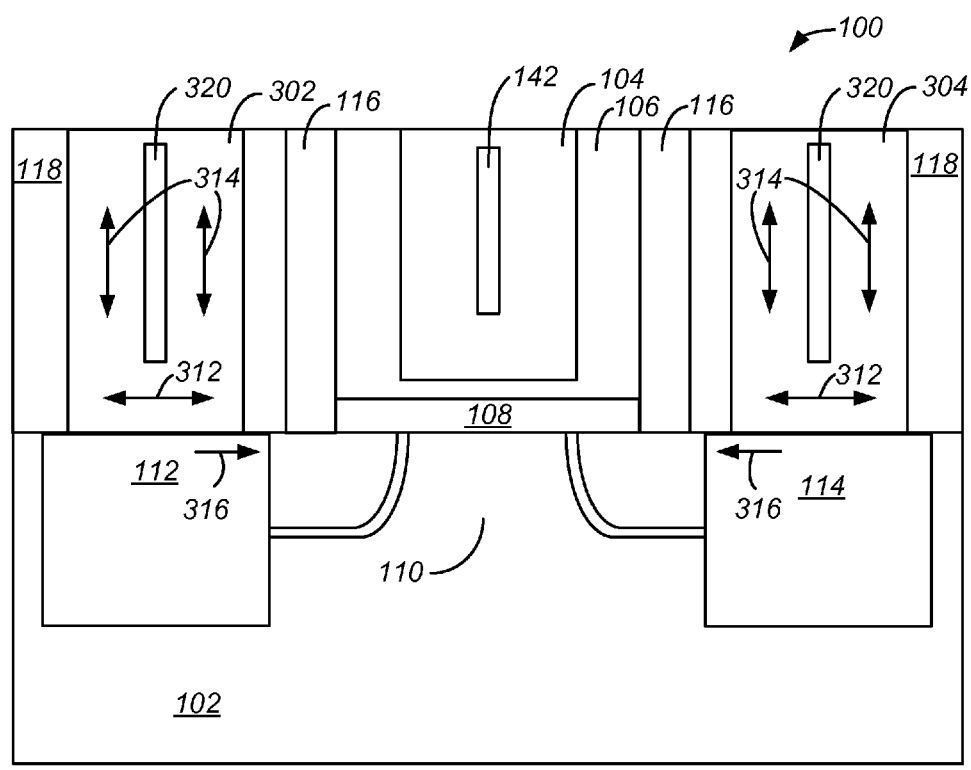
FIG. 3 is a schematic diagram of a PMOS device according to some embodiments.

FIG. 3 is a schematic diagram of a PMOS device according to some embodiments. The PMOS device 100 shown in FIG. 3 is the same PMOS device 100 shown in FIG. 1, with the addition of contact 302 for the source region 112 and contact 304 for the drain region 114.

In some embodiments, the contacts 302 and 304 include a compressive tungsten film. The vectors shown in FIG. 3 illustrate the effect of a compressive tungsten film in the contacts 302 and 304 of the PMOS device 100. The compressive tungsten films may exhibit different stresses. Some stresses in a compressive tungsten film may be in a plane parallel to the plane of the substrate 102 (parallel stresses) and some stresses in a compressive tungsten film may be in a plane normal to the plane of the substrate 102 (normal stresses). The parallel stresses of the compressive tungsten film are indicated by vectors 312. The normal stresses of the compressive tungsten film are indicated by vectors 314. The small seams 320 at the center of the compressive tungsten film of the contacts 302 and 304 may aid in neutralizing the normal stresses 314.

The source 112 and drain 114 regions of substrate 102 are strained by the parallel stresses of a compressive tungsten film in the contacts 302 and 304. The parallel stresses 312 of the tungsten exert stresses 316 in the source 112 and drain 114 regions. The stresses 316 in the source 112 and drain 114 regions decrease the lattice constant of the silicon in the channel region 110, which increases the hole mobility in the channel region.

Some embodiments of a PMOS device include a tensile tungsten film in the gate region. Some embodiments of a PMOS device include a compressive tungsten film for contacts to the source and drain regions. Some embodiments of a PMOS device include a tensile tungsten film in the gate region and a compressive tungsten film for contacts to the source and drain regions.

Figure 4:
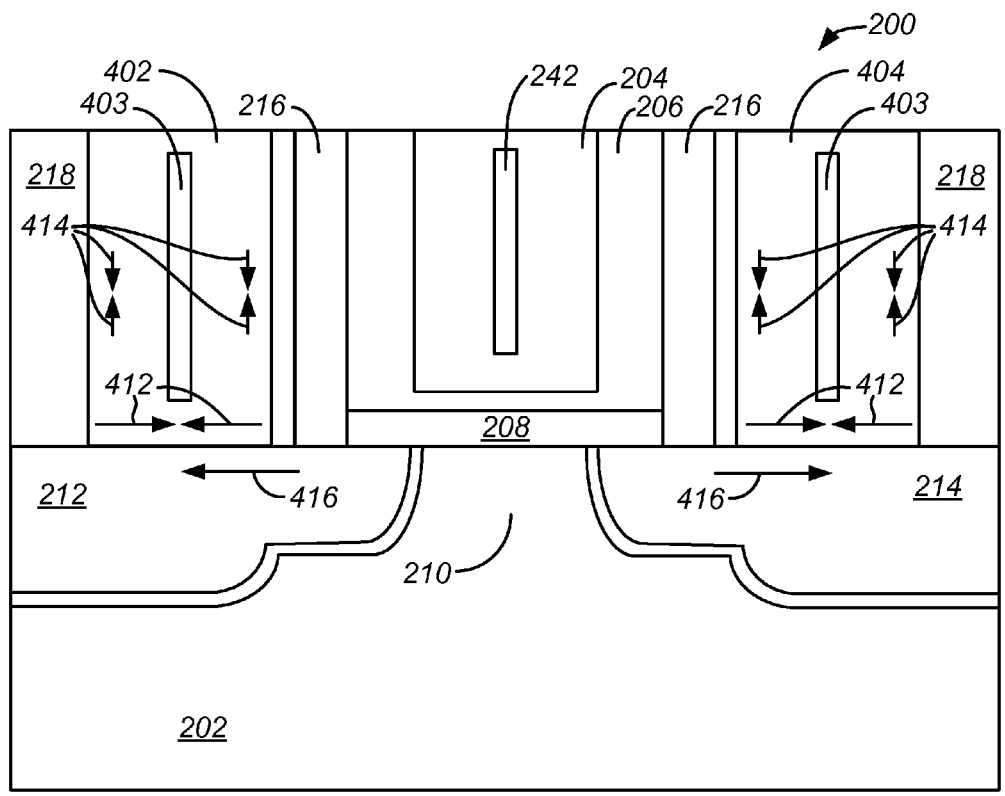
FIG. 4 is a schematic diagram of a NMOS device according to some embodiments.

FIG. 4 is a schematic diagram of a NMOS device according to some embodiments. The NMOS device 200 shown in FIG. 4 is the same NMOS device 200 shown in FIG. 1, with the addition of contact 402 for the source region 212 and contact 404 for the drain region 214.

In some embodiments, the contacts 402 and 404 include a tensile tungsten film. The vectors shown in FIG. 4 illustrate the effect of a tensile tungsten film in the contacts 402 and 404 of the NMOS device 200. The tensile tungsten films may exhibit different stresses. Some stresses in a tensile tungsten film may be in a plane parallel to the plane of the substrate 202 (parallel stresses) and some stresses in a tensile tungsten film may be in a plane normal to the plane of the substrate 202 (normal stresses). The parallel stresses of the tensile tungsten film are indicated by vectors 412. The normal stresses of the tensile tungsten film are indicated by vectors 414. The small seams 403 at the center of the tensile tungsten film of the contacts 402 and 404 may aid in neutralizing the normal stresses 414.

The source 212 and drain 214 regions of substrate 202 are strained by the parallel stresses of the tensile tungsten film in the contacts 402 and 404. The parallel stresses 412 of the tungsten exert stresses 416 in the source 212 and drain 214 regions. The stresses 416 in the source 212 and drain 214 regions increase the lattice constant of the silicon in the channel region 210, which increases the electron mobility in the channel region.

Some embodiments of a NMOS device include a compressive tungsten film in the gate region. Some embodiments of a NMOS device include a tensile tungsten film for contacts to the source and drain regions. Some embodiments of a NMOS device include a compressive tungsten film in the gate region and a tensile tungsten film for contacts to the source and drain regions.

Figure 5:
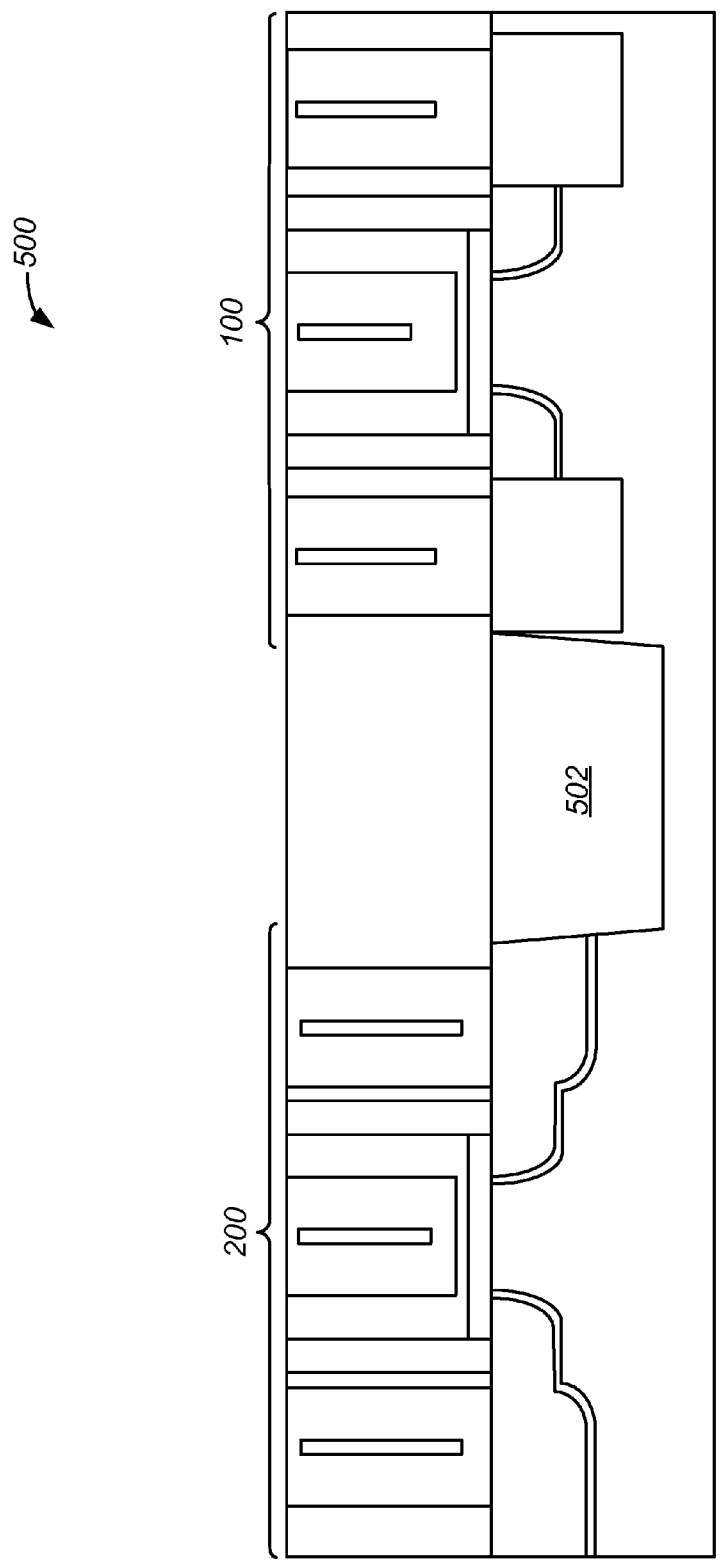
FIG. 5 is a schematic diagram of a semiconductor device according to some embodiments.

FIG. 5 is a schematic diagram of a semiconductor device according to some embodiments. The semiconductor device 500 shown in FIG. 5 includes a PMOS device 100 and a NMOS device 200. The PMOS device 100 and the NMOS device 200 are isolated from one another using a shallow trench isolation feature 502. Embodiments of the PMOS device 100 may include a tensile tungsten film in the gate region and/or compressive tungsten for contacts to the source and drain regions. Embodiments of the NMOS device 200 may include compressive tungsten in the gate region and/or tensile tungsten for contacts to the source and drain regions.

While the devices described above include planar transistors, the use of tensile and compressive tungsten films is not limited to these devices, and may be used in other devices. For example, tensile and compressive tungsten films may be used in three dimensional structures, including but not limited to tri-gate fin field effect transistors (tri-gate finFETs) and gate-all-around field effect transistors.

Methods for forming tensile and compressive tungsten films are described below.

Methods

Figure 6:
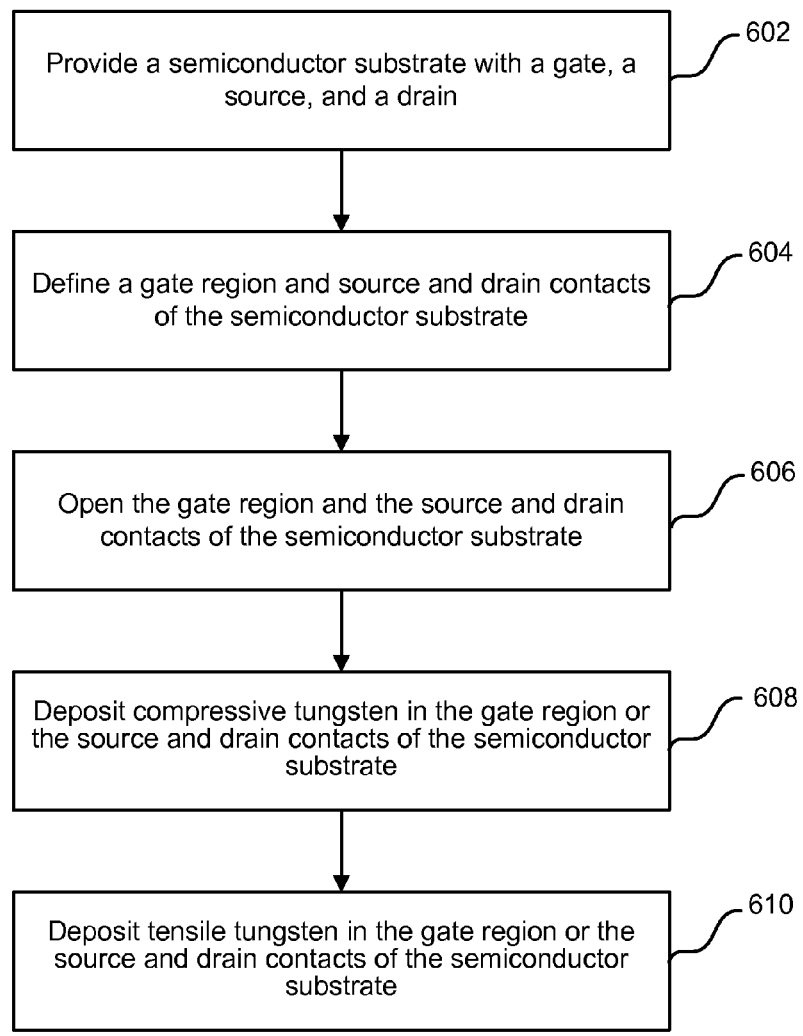
FIG. 6 depicts a process flow diagram illustrating operations in a method of fabricating a semiconductor device according to some embodiments.

FIG. 6 depicts a process flow diagram illustrating operations in a method 600 of fabricating a semiconductor device according to some embodiments. For example, the semiconductor device may include a PMOS device and/or a NMOS device, as described above. Embodiments of the method 600 may be used in "gate-first" and "gate-last" integration schemes.

In operation 602, a semiconductor substrate having a gate, a source, and a drain is provided. The gate, the source, and the drain may be a gate, a source, and a drain for a PMOS or NMOS device, as described above. Further, the semiconductor substrate may include more than one gate, source, and drain for multiple PMOS and/or NMOS devices.

In operation 604, a gate region and the source and drain contacts are defined. The source and drain contacts contact the source and drain of the semiconductor substrate. The gate region and the source and drain contacts may be defined using photolithography techniques and/or sacrificial films, as known to one having ordinary skill in the art.

In operation 606, the gate region and the source and drain contacts are opened. For example, the gate region and the source and drain contacts may be opened with etching techniques, including wet and dry chemical etching.

In operation 608, a compressive tungsten film is deposited in selected gate regions and/or source and drain contacts, as described herein. Areas where the compressive tungsten film is deposited may be defined using photolithography techniques and/or sacrificial films, for example.

In operation 610, a tensile tungsten film is deposited in selected gate regions and/or source and drain contacts, as described herein. Areas where the tensile tungsten film is deposited may be defined using photolithography techniques and/or sacrificial films, for example.

One having skill in the art will understand that particular sequence of operations may vary according to the implementation and that one or more operations may be omitted or additional operations may be performed. For example, in some embodiments, neutral stress tungsten or another metal may be deposited in addition to or instead of the tensile or compressive tungsten.

In some embodiments, a tungsten layer may be formed with an atomic layer deposition (ALD) type of process. ALD is a thin film deposition technique performed with one or more chemical reactants, also referred to as precursors. ALD is based on sequential, self-limiting surface reactions. The precursors are sequentially admitted to a reaction chamber in a gaseous state where they contact the work piece (i.e., the surface or surfaces that are being coated). For example, a first precursor is adsorbed onto the surface when it is admitted to a reaction chamber. Then, the first precursor reacts with a second precursor at the surface when the second precursor is admitted to the reaction chamber. By repeatedly exposing a surface to alternating sequential pulses of the precursors, a thin film of material is deposited. ALD processes also include processes in which a surface is exposed to sequential pulses of a single precursor, which deposits a thin film of material on the surface. ALD generally forms a conformal layer, i.e., a layer that faithfully follows the contours of the underlying surface.

Figure 7:
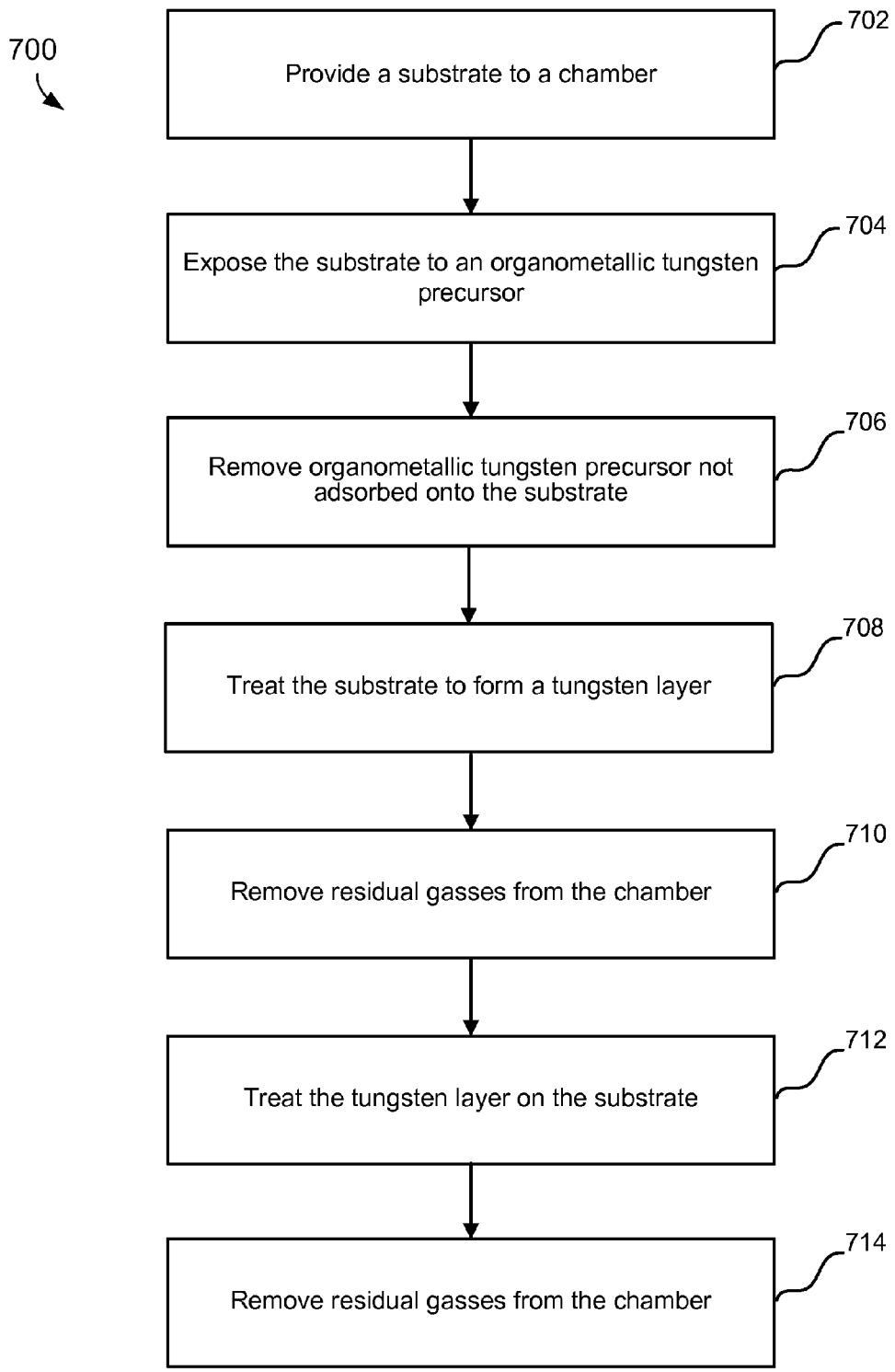
FIG. 7 depicts a process flow diagram illustrating operations in a method of depositing a tungsten layer according to some embodiments.

FIG. 7 depicts a process flow diagram illustrating operations in a method 700 of depositing a tungsten layer according to some embodiments. In operation 702, a substrate is provided to a chamber, such as a processing chamber or a vacuum chamber, for example. In some embodiments, the substrate may have a field region and a feature recessed from the field region. In some embodiments, the feature may be a high-aspect ratio feature. According to various embodiments, the substrate feature has an aspect ratio of at least 5:1, at least 10:1, at least 15:1, at least 20:1, at least 25:1, or at least 30:1. According to various embodiments, the feature size is characterized by the feature opening size in addition to or instead of the aspect ratio. For example, the feature opening size may be about 10 nm to 100 nm wide or about 10 nm to 50 nm wide. In some embodiments, the method may be used with features having narrow openings, regardless of the aspect ratio. In some embodiments, a feature includes sloped sidewalls such that the feature opening size is smaller than the width of the feature at the bottom of the feature. In some embodiments, a feature includes cavities and/or further features within the feature.

In some embodiments, the feature is formed within a dielectric layer on a substrate, with the bottom of the feature providing contact to an underlying metal layer. For example, the feature may be a contact for the source or drain region of a PMOS or NMOS device. In some embodiments, the feature is formed within a metal layer on a substrate. For example, the feature may be a metal in the gate region of a PMOS or NMOS device that is used to tune the work function difference between the gate and the channel region. In some embodiments, the feature includes a liner/barrier layer on its sidewalls and/or bottom. Examples of liner layers include Ti/TiN, TiN, WN, TiC, and WC. In addition to or instead of diffusion barrier layers, the feature may include layers such as an adhesion layer, a nucleation layer, a combination of thereof, or any other applicable material lining the sidewalls and bottom of the feature.

In operation 704, the substrate is exposed to an organometallic tungsten precursor. In some embodiments, the organometallic tungsten precursor is a halogen-free or a non-halogen organometallic tungsten precursor. Halogen-based chemistries can attack an underlying surface, such as silicon or silicide, for example, and the use of a halogen-free or a non-halogen organometallic tungsten precursor may prevent the tungsten precursor from chemically reacting with the underlying surface. Some halogen-free organometallic tungsten precursors may contain oxygen and nitrogen. In some embodiments, the organometallic tungsten precursor may include a cyclopentadienyl group, a tertiary-butyl group, a carbonyl group, or a dimethyl group. In some embodiments, the organometallic tungsten precursor may be aliphatic or aryl, including any of alkyl, alkenyl, alkynyl, and phenyl groups. The organometallic tungsten precursor may also have carbon and/or nitrogen, e.g., in the form of nitrosyl and amino groups. Some examples of such compounds include but are not limited to tungsten hexacarbonyl, ethylcyclopentadienyl dicarbonyl nitrosyl tungsten, ethylcyclopentadienyl dihydrogen tricarbonyl tungsten, Bis(cyclopentadienyl)Tungsten Dihydride, Bis(tert-butylimino)bis(tert-butylamino)tungsten, Cyclopentadienyltungsten(II)tricarbonyl hydride, Bis (tert-butylimino) bis(dimethylamino) tungsten, and (methylcyclopentadienyl)dicarbonylnitrosyltungsten. Halogen-free and non-halogen organometallic tungsten precursors are further described in U.S. Pat. No. 8,053,365, which is herein incorporated by reference. In some other embodiments, in operation 704 the substrate may be exposed to a tungsten-containing precursor that is not an organometallic tungsten precursor. Such tungsten-containing precursors include $WF_6$ and tungsten hexachloride ($WCl_6$), for example.

In operation 706, the organometallic tungsten precursor not adsorbed onto the substrate is removed from the chamber. For example, the chamber may be purged with a carrier gas such as argon, hydrogen, nitrogen, or helium. In certain embodiments argon is used as the carrier gas. The gas purge may clear the regions near the substrate surface of residual gas reactants.

In operation 708, the organometallic tungsten precursor is treated with a first treatment including a heat treatment or a plasma treatment to form a tungsten layer on the substrate. In some embodiments, the organometallic tungsten precursor may be treated with a plasma including argon, hydrogen, nitrogen, and/or ammonia. In some embodiments, operation 708 may include treating the substrate with an argon/hydrogen-containing plasma, for example. In some embodiments, the plasma may generated with a radio frequency (RF) power of about 0.1 watts to 2000 watts, about 0.1 watts to 1200 watts, or about 200 watts to 700 watts. In some embodiments, the substrate temperature during the plasma treatment may be about 100° C. to 550° C., about 100° C. to 350° C., or about 150° C. to 300° C. A hydrogen-containing plasma may react with or decompose the organometallic tungsten precursor to form the tungsten layer. Hydrogen-containing plasmas may also yield low resistivity tungsten layers. An ammonia or nitrogen-containing plasma may incorporate nitrogen in the tungsten layer that is forming.

In some embodiments, a heat treatment may include exposing the substrate to a temperature of about 100° C. to 550° C., about 100° C. to 350° C., or about 150° C. to 300° C. In some embodiments, a heat treatment may be performed in an atmosphere including one or more of argon, hydrogen, nitrogen, and ammonia.

In operation 710, residual gasses are removed from the chamber. For example, a vacuum may be pulled on the chamber, reducing the pressure in the chamber and removing the residual gasses. Alternatively, the chamber may be purged with a carrier gas such as argon, hydrogen, nitrogen, or helium. In some embodiments argon is used as the carrier gas.

In operation 712, the tungsten layer on the substrate is treated with a second treatment including a heat treatment or a plasma treatment. In some embodiments, operation 712 may be similar to operation 708. For example, in some embodiments, both operations 708 and 712 may include treating the substrate with a plasma containing argon, hydrogen, nitrogen, and/or ammonia. In some embodiments, the plasma power and/or the substrate temperature may be the same in operations 708 and 712, and in some other embodiments, the plasma power and/or the substrate temperature may be different in operations 708 and 712.

In some embodiments, a heat treatment in operation 712 may include exposing the substrate to a temperature of about 100° C. to 550° C., about 100° C. to 350° C., or about 150° C. to 300° C. In some embodiments, a heat treatment may be performed in an atmosphere including one or more of argon, hydrogen, nitrogen, and ammonia.

In some other embodiments, operation 712 may be different than operation 708. For example, in some embodiments, operation 708 may include treating the substrate at a first temperature with a plasma generated at a first power and containing hydrogen. Operation 712 may include treating the substrate at a second temperature with a plasma generated at a second power and containing ammonia. As another example, in some embodiments, operation 708 may include treating the substrate at a first temperature with a plasma generated at a first power and containing ammonia. Operation 712 may include treating the substrate at a second temperature with a plasma generated at a second power and containing hydrogen. Other combinations of plasma gasses may be used. As yet another example, in some embodiments, the first treatment may be a heat treatment and the second treatment may be a plasma treatment. In some other embodiments, the first treatment may be a plasma treatment and the second treatment may be a heat treatment.

In operation 714, residual gasses are removed from the chamber. For example, a vacuum may be pulled on the chamber, reducing the pressure in the chamber and removing the residual gasses. Alternatively, the chamber may be purged with a carrier gas such as argon, hydrogen, nitrogen, or helium. In some embodiments argon is used as the carrier gas.

In some embodiments, the tungsten layer formed in the method 700 may include tungsten metal, nitrogen, tungsten nitrides, carbon, and/or tungsten carbides. For example, when the tungsten precursor or tungsten layer is treated with an ammonia or nitrogen-containing plasma in operations 708 and/or 712, the tungsten layer may include nitrogen that may form tungsten nitrides. The tungsten layer may also include nitrogen, tungsten nitrides, carbon, and/or tungsten carbides when the organometallic tungsten precursor includes nitrogen and/or carbon.

In some embodiments, the tungsten layer may be treated with further treatments. For example, after operation 712, in operation 714 residual gasses may be removed from the chamber by pulling a vacuum on the chamber or the residual gasses may be purged with a carrier gas such as argon, hydrogen, nitrogen, or helium. Then, the tungsten layer on the substrate may be treated with a third treatment including a heat treatment or a plasma treatment. In some embodiments, the third treatment may be similar to the first and/or the second treatment, and in some other embodiments, the third treatment may be different from the first and/or the second treatment. Fourth, fifth, sixth, etc. treatments also may be performed.

In some embodiments, operations 712 and 714 may not be performed. That is, the tungsten layer may not be treated after it is formed in operation 708.

In some embodiments, method 700 may form a tungsten layer having a thickness of about 0.1 Angstroms to 1 Angstrom. One of skill ordinary skill in the art will recognize that a tungsten layer having a thickness of about 0.1 Angstroms indicates that the average film thickness is about 0.1 Angstroms, and that the tungsten film may not have a uniform thickness on a surface of the substrate.

In some embodiments, operations 704, 706, 708, 710, 712, and 714 or operations 704, 706, 708, and 710 may be repeated to form a tungsten layer having a desired thickness. For example, these operations may be repeated a number of times to form a tungsten layer having a thickness of about 1 Angstrom to about 400 Angstroms.

In some embodiments, before exposing the substrate to the organometallic tungsten precursor in operation 704, the substrate may be treated to remove oxides that may be present on exposed metals on the substrate surface. For example, the treatment may include a plasma treatment, such as a plasma sputtering treatment or exposure to a plasma including a reactive species, such as hydrogen or ammonia. Such a treatment may improve the adhesion of the tungsten layer to the substrate.

In some embodiments, a plasma may be present when exposing the substrate to the organometallic precursor in operation 704 in an ion-induced atomic layer deposition (iALD) type process. The plasma may be generated with a RF power of about 0.1 watts to 100 watts. The iALD type process may improve the adhesion of the tungsten layer or may improve the deposition rate of the tungsten layer. Further, iALD processes generally produce layers of material having a higher density compared to the density of layers produced with other methods. iALD processes also have further advantages, including providing very conformal layers and a precise control of the thickness of these layers. iALD processes are further described in U.S. Pat. Nos. 6,428,859, 6,416,822, 7,871,678, and 8,053,372, all of which are herein incorporated by reference. iALD processes are also described in U.S. patent application Ser. No. 13/244,009, filed Sep. 23, 2011, which is herein incorporated by reference.

In some embodiments, depending on the organometallic tungsten precursor and the process conditions in the method 700, a compressive tungsten layer or a tensile tungsten layer may be formed. For example, in some embodiments, a compressive stress in the tungsten layer may be at least about 0.5 gigapascals (GPa), or about 0.5 gigapascals to 3 gigapascals. In some other embodiments, a tensile stress in the tungsten layer may be at least about 0.5 gigapascals, or about 0.5 gigapascals to 4.5 gigapascals.

Table 1 shows the process conditions under which tungsten layers were deposited with a halogen-free organometallic tungsten precursor. Six different processes (i.e., processes A-F) were used to deposit tungsten layers of different thicknesses, ranging from about 45 Angstroms to 340 Angstroms thick. The stress in each deposited tungsten layer is also indicated, with a negative stress indicating a compressive layer and a positive stress indicating a tensile layer.

In processes A-E, a tungsten layer was formed and not subsequently treated; that is, the tungsten layer was deposited by performing multiple cycles of operations 704 through 710 described above with respect to FIG. 7 to achieve the desired tungsten thickness, and operations 712 and 714 were not performed. In process F, a tungsten layer was formed and was subsequently treated; that is, the tungsten layer was deposited by performing multiple cycles of operations 704 through 714 described above with respect to FIG. 7 to achieve the desired tungsten thickness. Operation 708 was performed with an argon and hydrogen containing plasma, and operation 712 was performed with an argon and ammonia containing plasma.

As shown in the table, at a given temperature (e.g., about 300° C.), a higher plasma power (e.g., about 600 watts RF power or above about 500 watts RF power) produces a compressive tungsten layer and a lower plasma power (e.g., about 200, 300, or 450 watts RF power, or less than about 500 watts RF power) produces a tensile tungsten layer. See processes C-F, which were performed at about 300° C. at different plasma powers. At a given plasma power (e.g., about 450 watts RF power), a lower process temperature (e.g., about 150° C. or below about 225° C.) produces a compressive tungsten layer and a higher process temperature (e.g., about 300° C. or above about 225° C.) produces a tensile tungsten layer. See processes A, B, and E, which were performed at a plasma power of about 450 watts at different temperatures.

TABLE 1

Process conditions for depositing a tungsten layer.

| process | process gasses | process temperature (° C.) | plasma power (W) | tungsten layer thickness (Å) | stress (GPa) |
|---|---|---|---|---|---|
| A | argon, hydrogen | 150 | 450 | 339.2 | −1.8 |
| B | argon, hydrogen | 150 | 450 | 47.5 | −2.0 |
| C | argon, hydrogen | 300 | 300 | 45.1 | 3.5 |
| D | argon, hydrogen | 300 | 600 | 87.2 | −0.4 |
| E | argon, hydrogen | 300 | 450 | 100.3 | 0.8 |
| F | argon, hydrogen/ argon, ammonia | 300 | 200 | 86.2 | 2.4 |

In some embodiments, a compressive tungsten layer may be formed with method 700, and then a tensile tungsten layer may be formed on the compressive tungsten layer with method 700 performed with different process conditions and/or tungsten precursors. In some other embodiments, a tensile tungsten layer may be formed with method 700, and then a compressive tungsten layer may be formed on the tensile tungsten layer with method 700 performed with different process conditions and/or tungsten precursors. Additional compressive and/or tensile tungsten layers may further be deposited on the tungsten layer. Such embodiments may allow for a tungsten layer having a desired final compressive or tensile stress, or a stress-free tungsten layer, to be formed.

In some embodiments, all of the operations 704, 706, 708, 710, 712, and 714 may be performed in the same process chamber. In some embodiments, all of the operations 704, 706, 708, 710, 712, and 714 may be performed on/with the same substrate holder or pedestal in the same process chamber. In some other embodiments, some of the operations 704, 706, 708, 710, 712, and 714 may be performed on/with different substrate holders or pedestals in the same process chamber. In some embodiments, some of operations 704, 706, 708, 710, 712, and 714 may be performed in different process chambers. For example, operations 704 through 708 may be performed in a first process chamber, the substrate may then be transferred to a second process chamber, and then operations 710 through 714 may be performed in the second process chamber.

Figure 8:
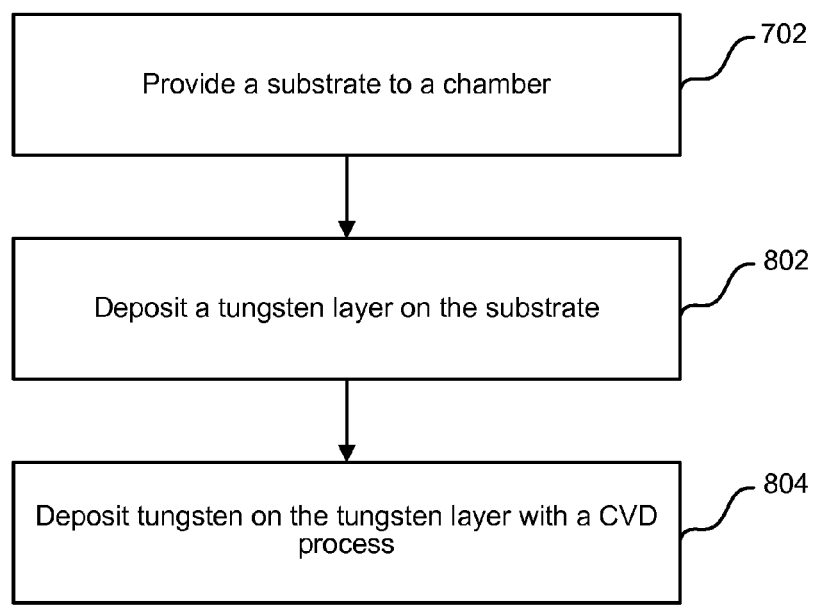
FIG. 8 depicts a process flow diagram illustrating operations in a method of depositing tungsten according to some embodiments.

FIG. 8 depicts a process flow diagram illustrating operations in a method 800 of depositing tungsten according to some embodiments. In operation 702, a substrate is provided to a chamber, as described above with respect to FIG. 7.

In operation 802, a tungsten layer having a desired thickness is deposited on the substrate. The tungsten layer maybe deposited with a method including operations 704 through 714 or operations 704 through 710, as described above with respect to FIG. 7. The tungsten layer may serve as a nucleation layer for further tungsten deposition. For example, a tungsten layer may be deposited to form a nucleation layer thick enough to support high quality tungsten deposition. According to some embodiments, a tungsten layer about 30 Angstroms to 50 Angstroms thick may be formed as a nucleation layer, and in some other embodiments, a tungsten layer about 10 Angstroms to 15 Angstroms thick may be formed as a nucleation layer.

After forming a tungsten layer, in operation 804, tungsten is deposited with a chemical vapor deposition (CVD) process. For example, a reducing agent and a tungsten-containing precursor may be flowed into the chamber to deposit a bulk tungsten layer. An inert carrier gas may be used to deliver one or more of the reactant streams, which may or may not be pre-mixed. Unlike an ALD-type process, this operation generally involves flowing the reactants continuously until the desired amount of material is deposited. In some embodiments, the CVD process may take place in multiple stages, with multiple periods of continuous and simultaneous flow of reactants separated by periods of one or more reactant flows diverted.

Various tungsten-containing gases including, but not limited to, $WF_6$, $WCl_6$, and tungsten hexacarbonyl ($W(CO)_6$) may be used as the tungsten-containing CVD precursor. In some embodiments the tungsten-containing CVD precursor is a halogen-containing compound, such as $WF_6$. In some embodiments the reducing agent is hydrogen gas, though other reducing agents may be used, including silane ($SiH_4$), disilane ($Si_2H_6$), hydrazine ($N_2H_4$), diborane ($B_2H_6$), and germane ($GeH_4$).

As discussed above, the four MOSFET device embodiments, i.e., a PMOS device including a tensile tungsten film in the gate region, a NMOS device including a tensile tungsten film for contacts to the source and drain regions, a PMOS device including a compressive tungsten film for contacts to the source and drain regions, and a NMOS device including a compressive tungsten film in the gate region, may be implemented independently of each other. In some embodiments of a fabrication process of a semiconductor device including a PMOS device and a NMOS device, a tensile tungsten film may be deposited for a PMOS device gate and NMOS device contacts in a single set of process operations. A single set of process operations may make depositing a tensile tungsten film more cost effective, for example. In some embodiments of a fabrication process of a semiconductor device including a PMOS device and a NMOS device, a compressive tungsten film may be deposited for a NMOS device gate and PMOS device contacts in a single set of process operations. Similarly, a single set of process operations may make depositing a compressive tungsten film more cost effective, for example.

In some embodiments in order to deposit both tensile tungsten films and compressive tungsten films in a single semiconductor device, masks and/or sacrificial films are used to control regions on which the tungsten is deposited. Similarly, in some embodiments in which both tensile tungsten films and compressive tungsten films are deposited in PMOS structures and NMOS structures being fabricated on a single semiconductor wafer, masks and/or sacrificial films are used to control regions on which the tungsten is deposited. Photolithography techniques employing masks and/or sacrificial films are well known to one of ordinary skill in the art.

Further, tensile tungsten films and compressive tungsten films may be integrated in a metal gate deposition module, in a contact metallization deposition module, or in a "gate-last" integration scheme. Processing apparatus are further described, below. Because the integration of each of these modules may be independent of other modules, tensile tungsten films and compressive tungsten films may be deposited in any type of tungsten deposition module.

Yet further, compressive tungsten films having different levels stress may be deposited in a NMOS device gate or a PMOS device contact. Similarly, tensile tungsten films having different levels stress may be deposited in a PMOS device gate or a NMOS device contact. The stress level of a tungsten film may be varied with deposition parameters in order to improve device performance.

Apparatus

The methods disclosed herein may be carried out in various types of deposition apparatus available from various vendors. Examples of suitable apparatus include a Novellus Concept-1 Altus™, a Concept 2 Altus™, a Concept-2 ALTUS-S™, a Concept 3 Altus™, an Altus Max™, or any of a variety of other commercially available tools. In some cases, the methods can be performed on multiple deposition stations sequentially. See, e.g., U.S. Pat. No. 6,143,082, which is incorporated herein by reference. In some embodiments, tungsten is deposited at a first station that is one of two, five, or even more deposition stations positioned within a single deposition chamber. Thus, the tungsten-containing precursor and other process gasses may be introduced to the surface of the semiconductor substrate, at the first station, using an individual gas supply system that creates a localized atmosphere at the substrate surface. The first station may then be used to perform treatments. One or more stations may then be used for further treatments or to deposit tungsten via a CVD process. Two or more stations may be used to perform CVD in a parallel processing operation. Alternatively, a wafer may be indexed to have the CVD operations performed over two or more stations sequentially.

Figure 9:
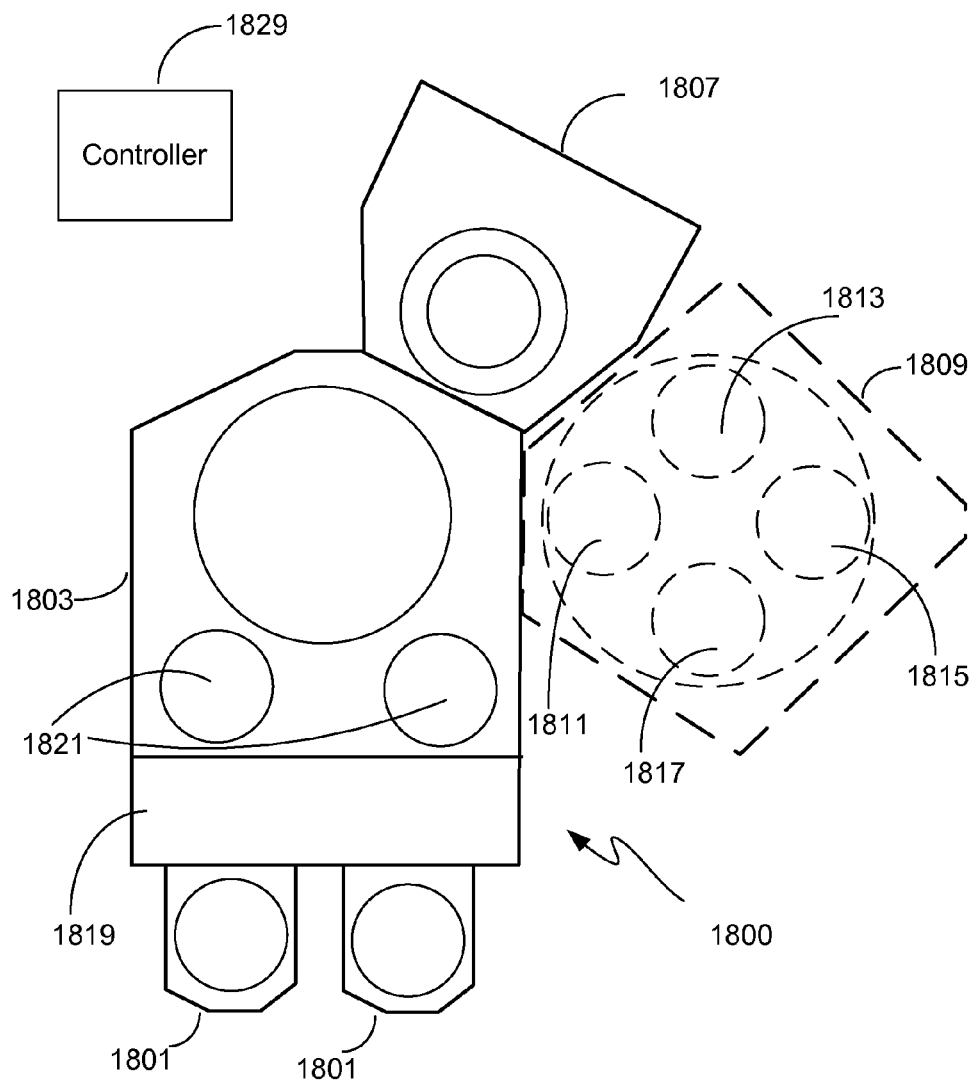
FIG. 9 is a schematic diagram of a processing system suitable for conducting tungsten deposition processes in accordance with various embodiments.
Figure 10:
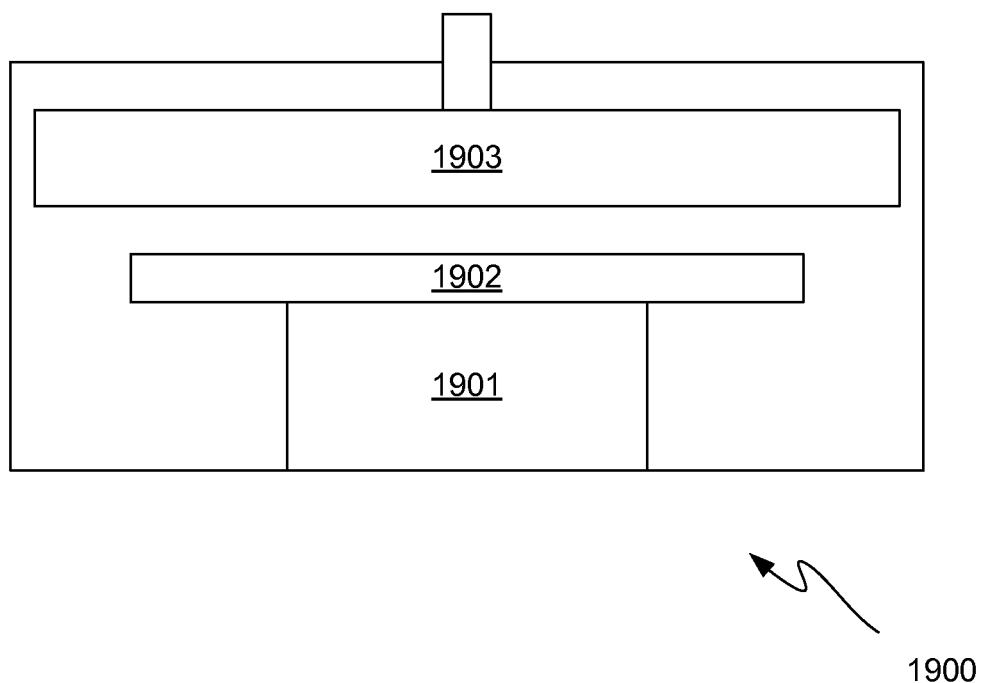
FIG. 10 is a schematic diagram of a deposition station suitable for conducting tungsten deposition processes in accordance with various embodiments.

FIG. 9 is a schematic diagram of a processing system suitable for conducting tungsten deposition processes in accordance with various embodiments. The system 1800 includes a transfer module 1803. The transfer module 1803 provides a clean, pressurized environment to minimize the risk of contamination of substrates being processed as they are moved between the various reactor modules. Mounted on the transfer module 1803 is a multi-station reactor 1809 capable of performing exposure to the tungsten-containing precursor, different treatments, and CVD processes according to various embodiments. Chamber 1809 may include multiple stations, including stations 1811, 1813, 1815, and 1817, which may sequentially perform these operations. For example, chamber 1809 could be configured such that station 1811 performs exposure to the tungsten-containing precursor and the first treatment, station 1813 performs the second treatment, and stations 1815 and 1817 perform CVD. Each deposition station includes a heated wafer pedestal and a showerhead, dispersion plate, or other gas inlet. An example of a deposition station 1900 is depicted in FIG. 10, including a wafer support 1902 and a showerhead 1903. A heater may be provided in a pedestal portion 1901.

Also mounted on the transfer module 1803 may be one or more single or multi-station modules 1807 capable of performing plasma or chemical (non-plasma) pre-cleans. The module may also be used for various other treatments, e.g., post liner tungsten nitride treatments. The system 1800 also includes one or more (in this case two) wafer source modules 1801 where wafers are stored before and after processing. An atmospheric robot (not shown) in an atmospheric transfer chamber 1819 first removes wafers from the source modules 1801 to the loadlocks 1821. A wafer transfer device (generally a robot arm unit) in the transfer module 1803 moves the wafers from loadlocks 1821 to and among the modules mounted on the transfer module 1803.

In some embodiments a system controller 1829 is employed to control process conditions during deposition. The controller will typically include one or more memory devices and one or more processors. The processor may include a central processing unit or a computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there is a user interface associated with the controller. The user interface may include a display screen, graphical software displays of the apparatus and/or process conditions, and user input devices such as pointing devices, keyboards, touch screens, microphones, etc.

Computer program code for controlling the deposition and other processes in a process sequence may be written in any conventional computer readable programming language; for example, programming languages include assembly language, C, C++, Pascal, Fortran, and others. Compiled object code or script is executed by the processor to perform the tasks identified in the program.

The controller parameters relate to process conditions such as, for example, process gas composition and flow rates, temperature, pressure, plasma conditions such as RF power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementations of embodiments disclosed herein in a single or multi-chamber semiconductor processing tool.

The apparatus/processes described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Other Embodiments

There are alterations, modifications, permutations, and substitute equivalents which fall within the scope of the disclosed embodiments. For example, embodiments have been described for depositing tensile or compressive tungsten films. The methods described above may be used to deposit tensile or compressive tungsten films on blanket surfaces and in features of a substrate. The methods described above are also applicable for forming other metallic films.

Embodiments of the methods may also be used for fabricating semiconductor structures with backside stress layers, as further described in U.S. Pat. No. 7,670,931, which is herein incorporated by reference.

It should also be noted that there are many alternative ways of implementing the methods and apparatus of the disclosed embodiments. It is therefore intended that the following appended claims be interpreted as including all such alterations, modifications, permutations, and substitute equivalents as fall within the true spirit and scope of the disclosed embodiments.

What is claimed is:

1. A method comprising:
   (a) providing a substrate to a chamber, the substrate having a field region and a feature recessed from the field region;
   (b) exposing the substrate to an organometallic tungsten precursor;
   (c) removing the organometallic tungsten precursor not adsorbed onto the substrate from the chamber;
   (d) treating the substrate with a first treatment including a heat treatment or a plasma treatment to form a tungsten layer on the substrate;
   (e) after operation (d), removing residual gasses from the chamber; and
   (f) treating the tungsten layer on the substrate with a second treatment including a heat treatment or a plasma treatment; and
   repeating operations (b) through (f), wherein a first time operations (b) through (f) are performed forms a tungsten layer having either a tensile stress or a compressive stress, and wherein a second time operations (b) through (f) are performed forms a tungsten-containing layer having the other of the tensile stress or the compressive stress.

2. The method recited in claim 1, wherein the first treatment during at least one of the times operations (b) through (f) are performed includes the plasma treatment, a first plasma including one or more of argon, hydrogen, nitrogen, and ammonia.

3. The method recited in claim 2, wherein the second treatment during at least one of the times operations (b) through (f) are performed includes the plasma treatment, a second plasma including one or more of argon, hydrogen, nitrogen, and ammonia, wherein a species in the first plasma is different than a species in the second plasma.

4. The method recited in claim 1, wherein the first plasma treatment and the second plasma treatment during at least one of the times operations (b) through (f) are performed include the same treatments.

5. The method recited in claim 1, wherein a temperature of the substrate is about 100° C. to 550° C. during the plasma treatments in operations (d) and (f).

6. The method recited in claim 1, wherein operation (b) is performed in the presence of a plasma generated with a radio frequency power of about 0.1 watts to 100 watts.

7. The method recited in claim 1, wherein the plasma treatments in operations (d) and (f) are performed with a plasma generated with a radio frequency power of about 0.1 watt to 2000 watts.

8. The method recited in claim 1, wherein the plasma treatments in operations (d) and (f) are performed with a plasma generated with a radio frequency power of about 200 watt to 700 watts.

9. The method recited in claim 1, wherein the heat treatments in operations (d) and (f) are performed at a temperature of about 100° C. to 550° C.

10. The method recited claim 1, wherein the heat treatments in operations (d) and (f) are performed in an atmosphere of the chamber including one or more of argon, hydrogen, nitrogen, and ammonia.

11. The method recited in claim 1, further comprising:
(g) after operation (f), removing residual gasses from the chamber; and
repeating operation (f).

12. The method recited in claim 1, further comprising: further comprising:
(g) after operation (f), removing residual gasses from the chamber; and
repeating operations (b) through (f).

13. The method recited in claim 1, wherein the tungsten layer or tungsten-containing layer includes carbon and/or nitrogen.

14. The method recited in claim 1, where in the organometallic tungsten precursor includes at least one functional group, and wherein the functional group is selected from the group consisting a cyclopentadienyl group, a tertiary-butyl group, a carbonyl group, and a dimethyl group.

15. The method recited in claim 1, wherein a compressive stress in the tungsten or tungsten-containing layer that has compressive stress is at least about 0.5 gigapascals.

16. The method recited in claim 1, wherein a tensile stress in the tungsten layer or tungsten-containing layer that has tensile stress is at least about 0.5 gigapascals.

17. The method recited in claim 1, further comprising:
before operation (b), exposing the substrate to a plasma treatment to remove oxides on metal surfaces on the substrate.

18. The method recited in claim 1, further comprising:
applying photoresist to the substrate;
exposing the photoresist to light;
patterning the photoresist and transferring the pattern to the substrate; and
selectively removing the photoresist from the substrate.

19. A non-transitory computer machine-readable medium comprising program instructions for control of a chamber, the instructions comprising code for:
(a) providing a substrate to the chamber, the substrate having a field region and a feature recessed from the field region;
(b) exposing the substrate to an organometallic tungsten precursor;
(c) removing the organometallic tungsten precursor not adsorbed onto the substrate from the chamber;
(d) treating the substrate with a first treatment including a heat treatment or a plasma treatment to form a tungsten layer on the substrate;
(e) after operation (d), removing residual gasses from the chamber;
(f) treating the tungsten layer on the substrate with a second treatment including a heat treatment or a plasma treatment; and
repeating operations (b) through (f), wherein a first time operations (b) through (f) are performed forms a tungsten layer having either a tensile stress or a compressive stress, and wherein a second time operations (b) through (f) are performed forms a tungsten-containing layer having the other of the tensile stress or the compressive stress.

20. A deposition apparatus comprising the non-transitory computer machine-readable medium of claim 19;
a chamber; and
a controller comprising the program instructions of the non-transitory computer machine-readable medium.

21. A system comprising the deposition apparatus of claim 20 and a stepper.

* * * * *